(12) United States Patent
Tanigami

(10) Patent No.: US 6,544,843 B2
(45) Date of Patent: Apr. 8, 2003

(54) PROCESS FOR MANUFACTURING SEMICONDUCTOR DEVICE

(75) Inventor: Takuji Tanigami, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 59 days.

(21) Appl. No.: 09/738,637

(22) Filed: Dec. 18, 2000

(65) Prior Publication Data

US 2001/0005620 A1 Jun. 28, 2001

(30) Foreign Application Priority Data

Dec. 17, 1999 (JP) .......................................... 11-359314

(51) Int. Cl.⁷ ...................... H01L 21/336; H01L 21/76; H01L 21/3205

(52) U.S. Cl. ...................... 438/257; 438/259; 438/424; 438/594

(58) Field of Search ................................ 438/257, 259, 438/594, 424

(56) References Cited

U.S. PATENT DOCUMENTS

| | | | |
|---|---|---|---|
| 5,962,889 A | | 10/1999 | Yamauchi et al. .......... 257/321 |
| 6,057,210 A | * | 5/2000 | Yang et al. ................ 438/427 |
| 6,159,822 A | * | 12/2000 | Yang et al. ................ 438/427 |
| 6,171,929 B1 | * | 1/2001 | Yang et al. ................ 438/427 |
| 6,194,271 B1 | * | 2/2001 | Lin et al. .................. 438/259 |
| 6,368,911 B2 | * | 4/2002 | Fu .............................. 438/248 |

FOREIGN PATENT DOCUMENTS

| | | | | |
|---|---|---|---|---|
| JP | 8-78389 A | | 3/1996 | |
| JP | 9-102554 A | | 4/1997 | |
| JP | 11-103033 | * | 4/1999 | ......... H01L/27/115 |

* cited by examiner

Primary Examiner—Amir Zarabian
Assistant Examiner—Toniae M. Thomas
(74) Attorney, Agent, or Firm—Nixon & Vanderhye P.C.

(57) ABSTRACT

A process for manufacturing a semiconductor device forming a plurality of protrusions with different widths so that a recess between adjacent protrusions has a predetermined width on a semiconductor substrate and thereafter forming an insulating layer for element isolation in the recess, wherein the insulating layer for element isolation is formed by the steps of:

(A) filling an insulating film for forming the insulating layer for element isolation in the recess to a higher level than top surfaces of the protrusions;

(B) removing the insulating film at least from a top surface of a narrow protrusion and etching back the insulating film in the recess to a level lower than the top surface of the narrow protrusion, thereby exposing the top surface and a side face of the narrow protrusion and a side face and a part of a top face next to the side face of a wide protrusion; and (C) forming a mask to cover the exposed top surfaces and side faces of the protrusions and the top surface of the insulating film in the recess, removing the insulating film remaining from the top surface of the wide protrusion, and removing the mask, thereby forming the insulating layer for element isolation in the recess.

13 Claims, 18 Drawing Sheets

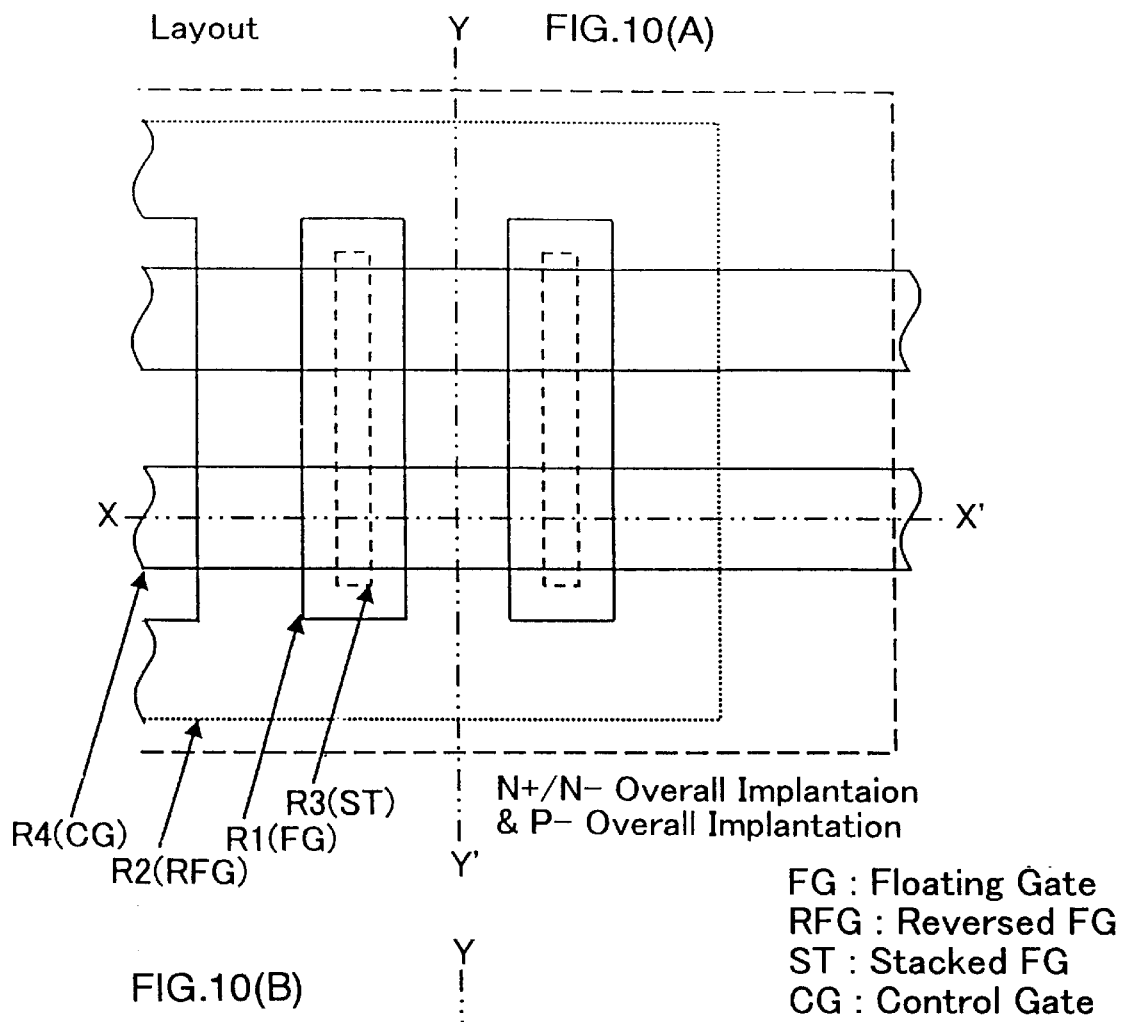
FIG.10(A) Layout
N+/N− Overall Implantaion & P− Overall Implantation
R4(CG) / R3(ST)
R2(RFG) R1(FG)
FG : Floating Gate
RFG : Reversed FG
ST : Stacked FG
CG : Control Gate
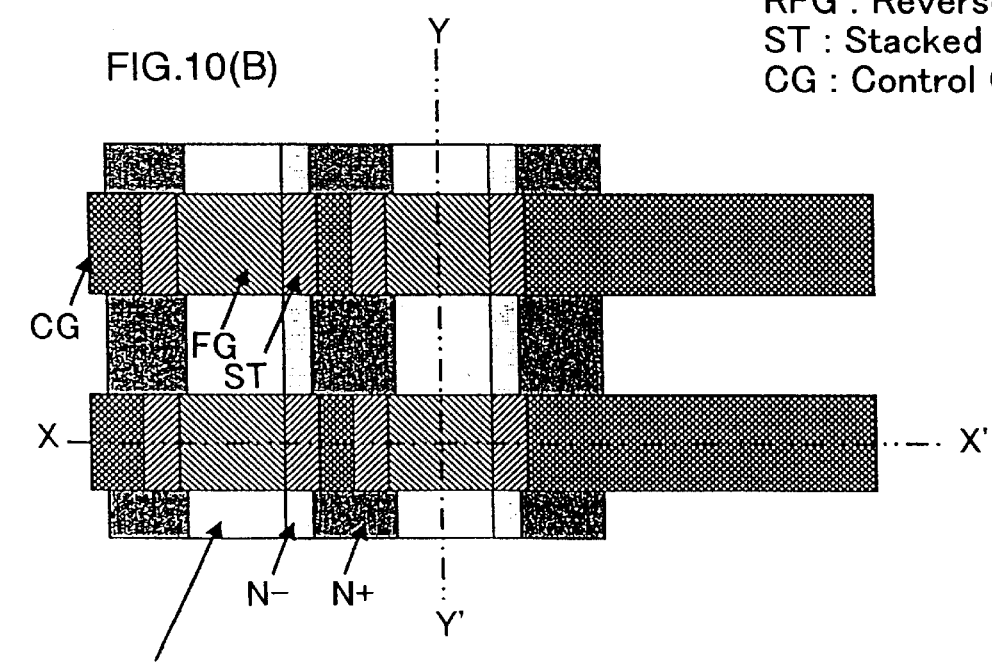
FIG.10(B)
P− Separate Implantation Region
(Self-Aligned With Control Gate)

FIG.12  Applied Voltages

|  | Selected WL | Non-Selected WL | Selected BL | Non-Selected BL | SL | Substrate |
|---|---|---|---|---|---|---|
|  | WL | WL0.2 | BL1 | BL0.3 | BL2 | PW |
| Reading | 3 | 0 | 0 | 0.3 | 1 | 0 |
| Writing | -12 | Open | 4 | Open | Open | 0 |
| Erasing | 12 | Open | -8 | Open | -8 | -8 |

Unit is V

PROCESS FOR MANUFACTURING SEMICONDUCTOR DEVICE

CROSS-REFERENCE TO RELATED APPLICATION

This application is related to Japanese Patent Application No. HEI 11(1999)-359314 filed on Dec. 17, 1999, whose priority is claimed under 35 USC §119, the disclosure of which is incorporated by reference in its entirety.

BACKGROUND OF THE INVENTION

1. Field of the Invention

The present invention relates to a process for manufacturing a semiconductor device, more particularly, a process for manufacturing a semiconductor device in which a plurality of protrusions with different widths are formed on a semiconductor substrate so that a recess between adjacent protrusions has a predetermined width and thereafter an element isolation layer is formed in the recess. The present invention is suitably applicable in particular to the manufacture of a semiconductor memory having floating gates and control gates in which source/drain regions are asymmetrically formed in self-alignment with respect to the floating gates and insulating films are placed on the source/drain regions.

2. Description of Related Art

For embedding a chemical vapor deposited (CVD) insulating film in a recess formed by patterning on a semiconductor substrate, generally, the CVD insulating film is deposited in the recess and on a polish stopper film disposed on protrusions, and then flattened by a chemical mechanical polishing (CMP) process. The CVD film is deposited on the stopper film thicker than a thickness required for element isolation, and then the CVD film needs to be polished away to the required thickness.

However, the CMP process has some problem in that, if a polish amount increases, a wide element isolation region is polished and consequently the thickness of the CVD film in the region is decreased (a dishing phenomenon). Therefore, it is difficult to ensure the thickness of the insulating film embedded in the recess.

To cope with this problem, Japanese Unexamined Patent Publication No. HEI 8(1996)-78389 proposes a technique in which the polish amount in the CMP process is decreased. This technique is described as prior art with reference to FIGS. 17(a) to 17(c), 18(d) to 18(f) and 19(g) to 19(i), which illustrate a process for manufacturing a semiconductor device according to an embodiment of the prior art.

A thermal oxide film 2 made of a silicon oxide film is formed in a thickness of about 10 nm in an active region of a P-type semiconductor substrate 1 by thermal oxidation, and a silicon nitride film 5 is formed in a thickness of 200 nm by chemical vapor deposition (CVD). Subsequently, as shown in FIG. 17(a), the silicon nitride film 5 and the thermal oxide film 2 are sequentially etched by reactive ion etching using a resist mask formed by photolithography. Further, the semiconductor substrate 1 is etched to form trenches 161 and 163 of 300 nm depth in the semiconductor substrate 1 (see FIG. 17(b)). Subsequently, a silicon oxide film 17 is formed in a thickness of 20 nm within the trenches by thermal oxidation (see FIG. 17(c)). Thereafter, in a state in which the silicon nitride film 5 to be a stopper layer in a later step remains on protrusions, silicon oxide films 101 to 104 as insulating films are deposited to a thickness of about 350 nm by a high-density plasma enhanced chemical vapor deposition (HDP-CVD) method (see FIG. 7(d)). Thus, triangular silicon oxide films 104 and trapezoid silicon oxide films 102 are formed on the silicon nitride film 5. The silicon oxide films 102 and 104 on the protrusions are separated from the silicon oxide films 101 and 103 in the recesses by the silicon nitride films 5 which will be stopper layers. Subsequently, as shown in FIG. 18(e), a silicon nitride film 15 which is to be an etching mask layer later is deposited to a thickness of 20 nm on the entire surface by CVD. Then the top of the mask layer 15 on the silicon oxide films 102 and 104 in the protrusions are removed by polishing (see FIG. 18(f)). Subsequently, the etching of the silicon oxide films 102a and 104a progresses from removed parts of the mask layer 15 by a wet etch-back process (using diluted hydrofluoric acid), to fully expose the top faces of the silicon nitride films 51 and 52 as the stopper layers (see FIG. 19(g)). At this time, the silicon oxide films 101 and 103 in the trenches, which are covered with the mask layers 15a and 15b, are not etched in this wet etch back process. Thereafter, the silicon nitride films 15a and 15b as the mask layers and the silicon nitride films 51 and 52 as the stopper layers are removed with heated phosphoric acid (see FIG. 19(h)), and flattening is carried out (see FIG. 19(i)).

Thereafter, though not shown, in order to improve a gate coupling ratio, a poly-crystalline silicon film doped with phosphorus as an impurity is deposited, and then etched by reactive ion etching using a resist film patterned by photolithography as a mask, so as to form upper-layer floating gates. Here, the mask has openings above thick parts of the silicon oxide film so that the silicon oxide film can endure the etch amount of an ONO film when the control film is formed later.

Thereafter, formed is an ONO film which is a dielectric film between the floating gates and the control gates.

Next, a polycide film which is a material for the control gates is deposited and formed into control gates by reactive ion etching using a resist film patterned by photolithography as a mask.

Subsequently, after the resist film is removed, an impurity layer for isolating memory elements is formed using the control gates as a mask. Thereafter, an interlayer dielectric film, contact holes and metal interconnects are formed by known techniques.

However, in some cases, the top face of the embedded insulating film is desired to be higher than the surface of the semiconductor substrate. For example, in the case where the thickness of the element isolation film is required to be greater than the depth of trenches formed in the semiconductor substrate, the insulating film inevitably needs to be deposited to a thickness larger than the depth of the trenches formed in the semiconductor device. Or, in the case where trenches are not formed in the semiconductor substrate but the insulating film is embedded in recesses formed on the semiconductor substrate by patterning, it is preferable that the insulating film embedded in the recesses is formed to have a higher level than the top face of a stopper film patterned on the semiconductor substrate, for ensuring the thickness of the insulating film. Consequently, the insulating film deposited in the recesses connects to triangular or trapezoid oxide films on the stopper film. If a mask layer deposited in this state, a desired configuration cannot be obtained. Japanese Unexamined Patent Publication No. HEI 8(1996)-78389 limits the thickness of the insulating film embedded in the recesses to such that the top face of the insulating film embedded in the recesses is lower than the top face of the patterned stopper film on the semiconductor substrate. In this sense, the process of this publication is limited.

Furthermore, as this prior art, for depositing the insulating film so that the insulating film embedded in the recess will not connect to the triangular or trapezoid oxide films on the stopper film, it is necessary to increase a sputter component in HDP-CVD (the sputter component means a component sputtered by atoms of Ar, $O^2$ or the like; it is necessary to increase the sputter component and form a thin insulating film for separating the insulating film). Accordingly, the substrate and elements are more damaged. Further, a contact face of the stopper layer 5 and the mask layer 15 as shown in the prior art is so small that failures such as pinholes may take place.

Further, as regards fine traces of a patterned stopper film (in other words, in small active regions) which are surrounded by wide traces of the patterned stopper film (in other words, in large active regions) and separated from each other by element isolation regions, a lower triangular oxide film is formed on a fine trace 53 of the patterned stopper film than the oxide film on a wide trace 52 of the patterned stopper film, as shown in FIG. 20(a). Accordingly, the mask layer 15c on the fine trace is not polished sufficiently, and the top of the mask layer 15c cannot be opened using the CMP process with good control (see FIG. 20(b)).

As a result, the mask layers 15a and 15c or the stopper films 51, 52 and 53 are removed while the angular oxide film 104c on the fine pattern traces of the stopper film remains unremoved as shown in FIG. 20(c). At this time, the oxide film 104c is lifted off and causes dust.

Also as shown n FIG. 21(a), where a wide trace 52 of the patterned stopper film (active region) and a wide element isolation region 103 coexist, when the mask layer 15 in the uppermost layer above the wide trace 52 of the stopper film pattern is removed, the mask layer 15 is also removed from the uppermost layer in the central part of the wide element isolation region 103 owing to a characteristic of the CMP process, with a mask layer 15d remaining as shown in FIG. 21(b). Therefore, the embedded oxide film in the element isolation region is etched by a later wet etch-back process (with diluted hydrofluoric acid) as indicated by 103d in FIG. 21 (c).

As discussed above, also in the case where the polish amount by the CMP process is reduced as in the prior art, dependency on the density of a pattern is great so long as the CMP process is used. This dependency is much greater in the case where wide and narrow regions are mingled as shown in FIGS. 20(a) to 20(c) and FIGS. 21(a) to 21(c).

SUMMARY OF THE INVENTION

In these circumstances, the present invention is to provide a process for forming a good insulating film for element isolation stably without using the CMP process. The process of the invention is less restricted and causes less damage.

Above all, the present invention is to provide a process which enables easy and stable formation of memory cells having an insulating film in self-alignment with floating gates in a semiconductor memory having the floating gates and control gates.

The present invention provides a process for manufacturing a semiconductor device comprising the steps of:

(I) forming a plurality of protrusions with different widths so that a recess between adjacent protrusions has a predetermined width on a semiconductor substrate; and (II) in order to form an insulating layer for element isolation in the recess,
(A) filling an insulating film for forming the insulating layer for element isolation in the recess to a higher level than top surfaces of the protrusions;
(B) removing the insulating film at least from a top surface of a narrow protrusion and etching back the insulating film in the recess to a level lower than the top surface of the narrow protrusion, thereby exposing the top surface and a side face of the narrow protrusion and a side face and a part of a top face next to the side face of a wide protrusion; and
(C) forming a mask to cover the exposed top surfaces and side faces of the protrusions and the top surface of the insulating film in the recess, removing the insulating film remaining from the top surface of the wide protrusion, and removing the mask.

In the present invention, the protrusions and the recesses may be made by forming a plurality of protrusions on the top face of the semiconductor substrate. Alternatively, they may also be made by forming the recesses entirely or partially in a surface layer of the semiconductor substrate itself.

In the present invention, the recess has a predetermined width which may be a minimum width required for obtaining a necessary insulative property for element isolation. More particularly, if the insulating layer for element isolation is formed of an oxide film, the width may be 100 to 300 nm.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 10(a) and 10(b) are plan views for illustrating the process of manufacturing a semiconductor device of the present invention;

FIG. 12 is an applied voltage table for illustrating an operational principle of a semiconductor device in accordance with the present invention;

DESCRIPTION OF THE PREFERRED EMBODIMENTS

In the case where the semiconductor device according to the present invention is one having floating gates formed on a semiconductor substrate with intervention of a tunnel oxide film and control gates formed on the floating gates with intervention of an interlayer capacitive film, the process for manufacturing the semiconductor includes, after an insulating film for forming an insulating layer for element isolation (referred to as an element isolation insulating film hereinafter) is filled in the recesses, etching the insulating film by isotropic etch back so that the insulating film is entirely removed from the top face of a narrow protrusion (fine stopper film) and so that the top face of the insulating film filled in the recesses becomes lower than the top face of a stopper film. Thus, by this etch back, the top and side faces of the patterned stopper film are exposed at least partially and exhibit an improved contact to a mask (layer) to be deposited on the stopper film, and triangular or trapezoid oxide films remaining on the stopper film are completely separated from the insulating film filled in the recesses.

Thus, the triangular or trapezoid oxide films remain only on sufficiently wide traces of the patterned stopper film. Therefore, it is possible to completely remove the triangular or trapezoid oxide films remaining on the stopper film selectively by removing the mask layer lying on the triangular or trapezoid oxide films with use of a resist mask without need to pay attention to lamination accuracy.

As described above, according to the present invention, it is possible to embed the insulating film in the recesses between the trances of the patterned stopper film easily without using the CMP process while ensuring a sufficient thickness for the insulating film.

The present invention is now described in detail by way of embodiments thereof with reference to the attached drawings, which should not be construed to limit the scope of the present invention.

Embodiments

FIGS. 10(a) and 10(b) are plan views of a semiconductor device. FIGS. 1(a) to 1(d) to FIGS. 9(i) to 9(l) are schematic sectional views taken along an X direction and a Y direction of the plan views of FIGS. 10(a) and 10(b), illustrating processes of manufacturing a semiconductor device in accordance with the present invention. In FIGS. 1(a) to 1(d) to FIGS. 9(i) to 9(l), sectional views taken along line X–X' of FIGS. 10(a) and 10(b) are seen on the left and sectional views taken along line Y–Y' of FIGS. 10(a) and 10(b) are seen on the right.

First Embodiment

Now explanation is given of a first embodiment of the process for manufacturing a semiconductor device of the present invention with reference to FIGS. 1(a) to 1(d) to FIGS. 3(i) to 3 (l).

Figure 1A:
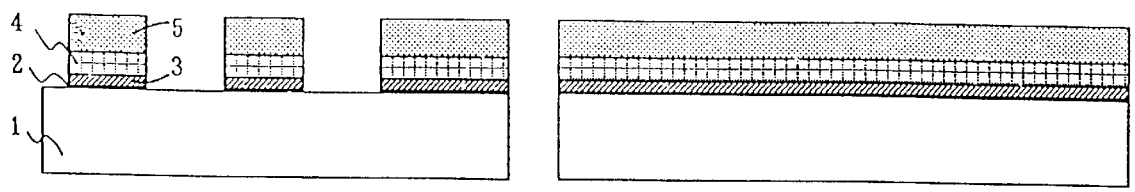
FIGS. 1(a) to 1(d) are schematic sectional views illustrating steps (a) to (d) of a process of manufacturing a semiconductor device in accordance with a first embodiment of the present invention.
Figure 1B:
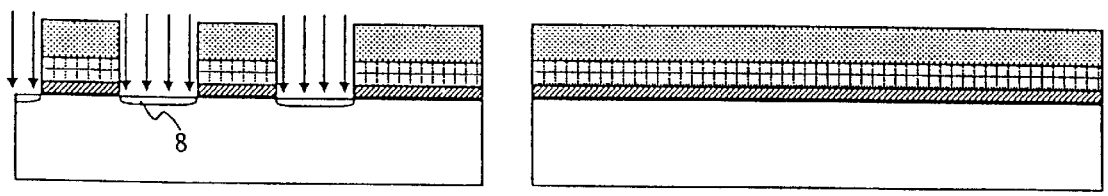
Figure 1C:
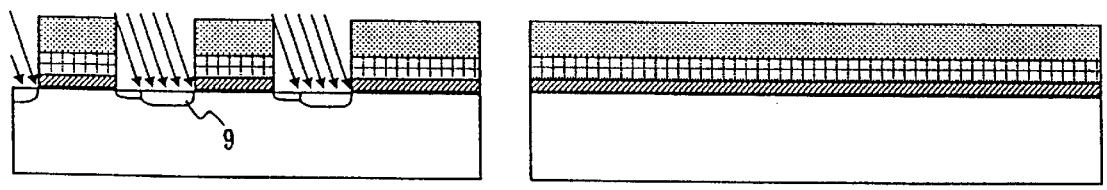

First a tunnel oxide film 2 of a silicon oxide film with a thickness of about 10 nm is formed on an active region of a P-type semiconductor substrate 1 by thermal oxidation. Then a polycrystalline silicon film 3 doped with phosphorus as an impurity is formed as a first electroconductive film with a thickness of 50 nm. This polycrystalline silicon film 3 is a material for forming the floating gate. A silicon oxide film 4 as a first insulating film and a silicon nitride film 5 as a second insulating film are deposited to a thickness of about 50 to 150 nm and about 200 nm, respectively, by CVD. Then, as shown in FIG. 10 and FIG. 1(a), the silicon nitride film 5, the silicon oxide film 4, the polycrystalline silicon film 3 and the tunnel oxide film 2 are sequentially etched by reactive ion etching using a resist film R1 (for forming the floating gate) produced by photolithography as a mask, to form the floating gate.

Subsequently, after the resist film R1 is removed, impurity layers 8 and 9 are formed using the floating gate as a mask. For example, arsenic is implanted at an implantation angle of 0 degree, an implantation energy of 5 to 40 KeV and a dose of 5 E12 to 5 E13/cm$^2$ (see FIG. 1(b)). Then, arsenic is implanted at an implantation angle of −7 to −25 degrees, an implantation energy of 5 to 40 KeV and a dose of 1 E12 to 1 E16/cm$^2$ (see FIG. 1(c)). Thereafter, the impurity is activated by thermal treatment. A silicon oxide film 10 as the element isolation insulating film is deposited to a thickness of about 400 to 600 nm by HDP-CVD (see FIG. 1(d)). The entire surface of the silicon oxide film 10 is etched back by an isotropic wet etch-back method (with diluted hydrofluoric acid), to completely expose the top face of fine traces of the patterned silicon nitride film 51.

The definition of the fine traces, i.e., narrow protrusions, depends upon the thickness and film forming conditions of the silicon oxide film 10 deposited by HDP-CVD. For example, in the case where the HDP-CVD silicon oxide film 10 of about 400 to 600 nm thickness is formed under such conditions that an extension line of an inclined part of the HDP-CVD silicon oxide film 10 crosses the top face of a silicon nitride film 51 or 52 on the protrusion near an edge of the silicon nitride film 51 or 52 and the inclined part forms an angle of about 50° to 60° with respect to the surface of the substrate, as in this embodiment, the fine traces are those having a width of about 500 to 800 nm.

At this time, a triangular or trapezoid silicon oxide film remains on the silicon nitride film 52 which has a width larger than the above-mentioned range, while a part of the top face and a part of side faces of the silicon nitride film 52 are exposed.

Figure 2E:
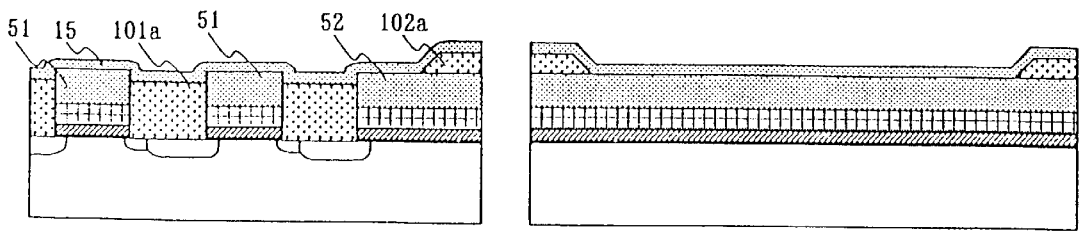
FIGS. 2(e) to 2(h) are schematic sectional views illustrating steps (e) to (h) of the process of manufacturing a semiconductor device in accordance with the first embodiment of the present invention.
Figure 2F:
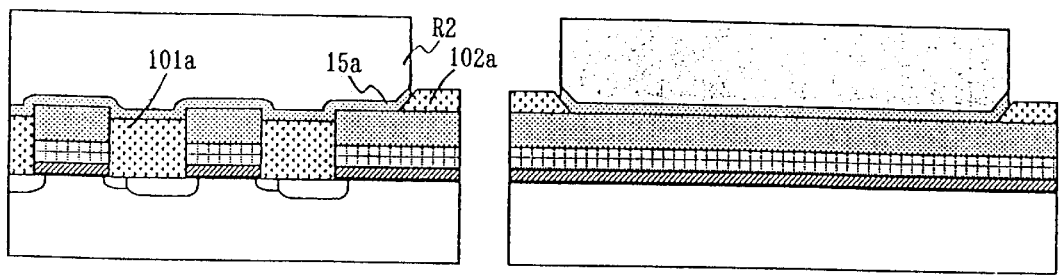

Subsequently, a mask layer 15 of a silicon nitride film is formed as a third insulating film on the entire surface of the resulting substrate. The mask layer contacts closely to the top face and part of side faces of the silicon nitride film 51 and part of the top face and part of side faces of the silicon nitride film 52 (see FIG. 2(e)). Next, as shown in FIGS. 10(a), 10(b) and 2(f), the silicon nitride film 15 is selectively etched by reactive ion etching using a resist film R2 produced by photolithography as a mask which has openings above the remaining silicon oxide film 102a. By this step, the embedded oxide film 101a is covered with silicon nitride films 51, 52 and 15a, and the remaining silicon oxide film 102a is partially exposed.

Figure 2G:
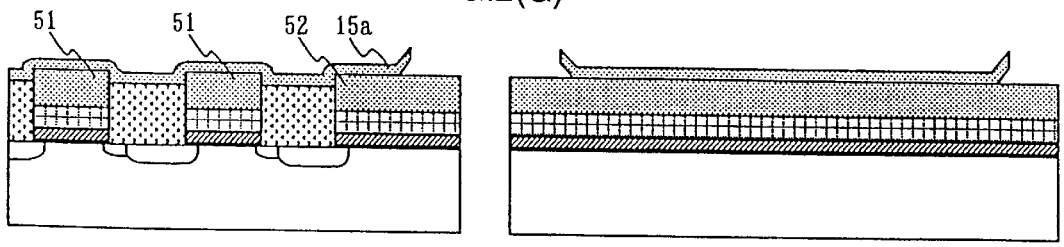

In this state, the silicon oxide film 102a can be selectively removed by utilizing the wet etch-back method (with diluted hydrofluoric acid), while at the same time the embedded oxide film 101a is protected and its thickness is ensured (FIG. 2(g). Here, variations in the thickness of the embedded oxide film 101a depend upon variations in the thickness of the HDP-CVD silicon oxide film 10 at deposition and variations in etch amount at etching the entire surface of the HDP-CVD silicon oxide film 10. Even if the variations in etch amount by the CMP method is assumed to be the same as that by the wet etch-back method, the wet etch-back method, which is less affected by the density of a pattern, provides more excellent uniformity. Generally, the wet etch-back method (variations in etch amount: 3 to 5 %) provides better in-planar uniformity than the CMP method (variations in etch amount: 5 to 10 %) if the same pattern is used.

Figure 2H:
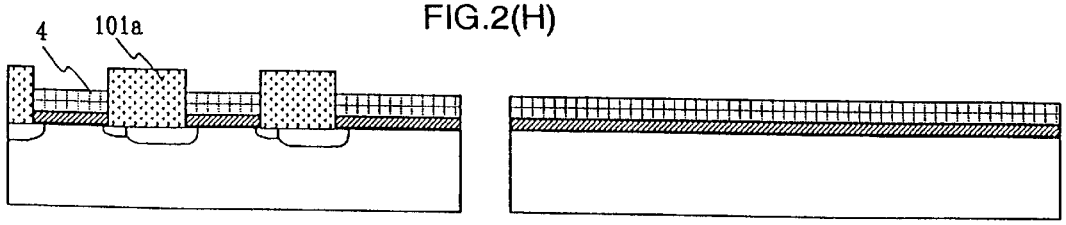
Figure 3I:
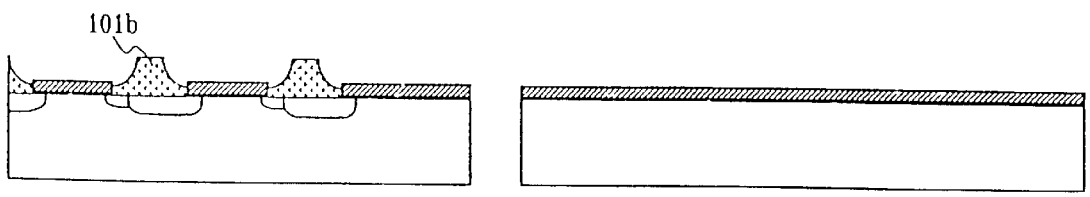
FIGS. 3(i) to 3(l) are schematic sectional views illustrating steps (i) to (l) of the process of manufacturing a semiconductor device in accordance with the first embodiment of the present invention.
Figure 3J:
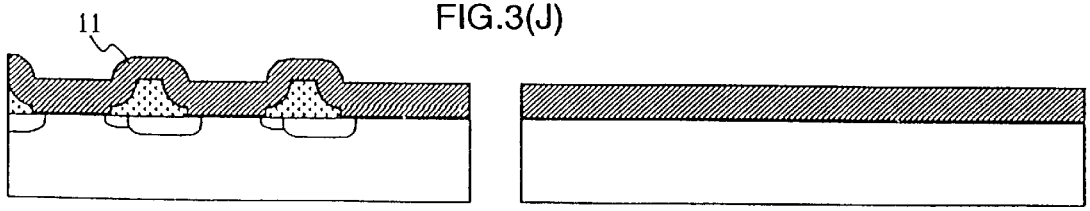
Figure 3K:
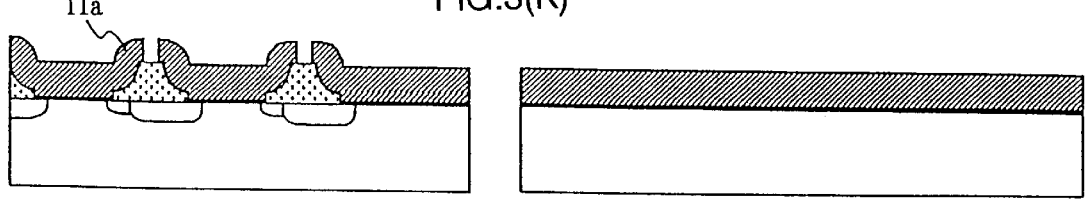
Figure 3L:
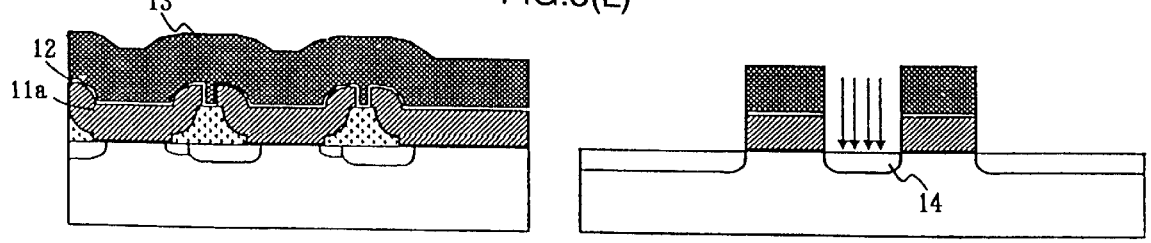
Figure 4A:
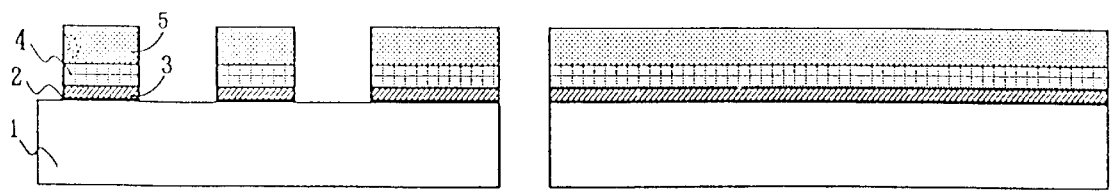
FIGS. 4(a) to 4(d) are schematic sectional views illustrating steps (a) to (d) of a process of manufacturing a semiconductor device in accordance with a second embodiment of the present invention.
Figure 4B:
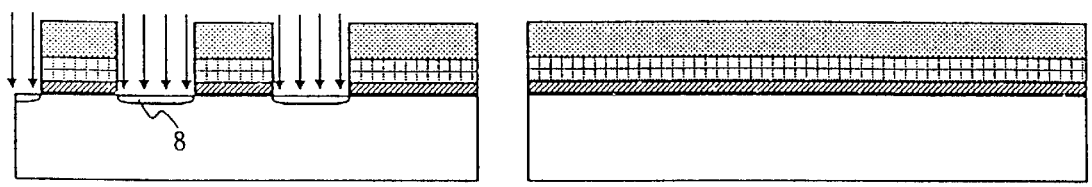
Figure 4C:
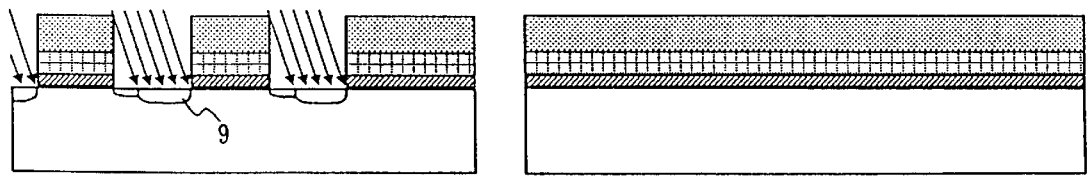
Figure 4D:
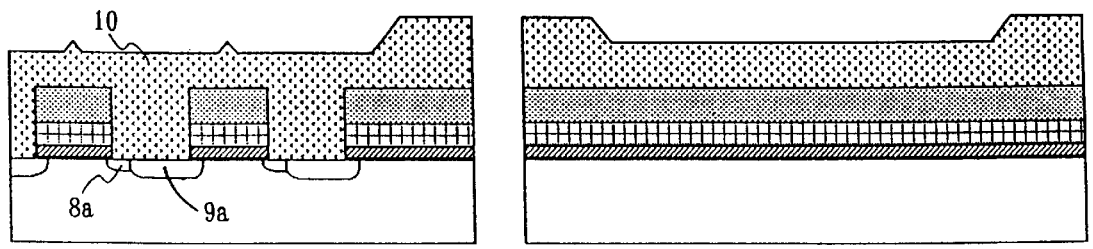

Subsequently, the silicon nitride films 15a, 51 and 52 are removed with heated phosphoric acid (see FIG. 2(h)). Further, the wet etch-back method (with diluted hydrofluoric acid) is conducted for removing the silicon oxide film 4 and also etching round the silicon oxide film 101a. Thus formed is a silicon oxide film 101b which projects upward between floating gates and has a thickness of about 100 nm which is sufficient for protecting the substrate (see FIG. 3(i)). Thereafter, for improving the gate coupling ratio, a polycrystalline silicon film 11 doped with phosphorus as an impurity is deposited 100 nm (see FIG. 3(j)) and etched by reactive ion etching using a resist film R3 patterned by photolithography as a mask to form an upper-layer floating gate (see FIG. 3(k)). The resist mask R3 has an opening above a thick part of the silicon oxide film 101b and the silicon oxide film endures the etch amount of an ONO film 12 when the control gates are formed later.

Thereafter, the ONO film 12 (of three layers of a silicon oxide film/a silicon nitride film/a silicon oxide film) is formed. The ONO film 12 will serve as a dielectric film between the floating gate and the control gate. More particularly, a silicon oxide film of 6 nm thickness is formed on the surface of the floating gate by thermal oxidation, a silicon nitride film of 8 nm thickness is formed by the CVD method, and a silicon oxide of 6 nm thickness is formed, sequentially.

Next, a polycide film 13 which is a material for the control gate is deposited to a thickness of 200 nm. As the polycide film, may be mentioned a combination of 100 nm of a polycrystalline silicon film doped with phosphorus as an impurity and 100 nm of a tungsten silicide film sequentially laminated, for example.

The control gate is formed by reactive ion etching using a resist film R4 patterned by photolithography as a mask. That is, the polycide film 13 to be the control gate, the ONO film 12, the polycrystalline silicon film 11a and the polycrystalline silicon film 3 are sequentially etched.

Subsequently, after the resist film R4 is removed, an impurity layer 14 for isolating memory elements is introduced using the control gate as a mask. For example, boron is implanted at an implantation angle of 0 degree, an implantation energy of 10 to 40 KeV and a dose of 5 E12 to 5 E13/cm$^2$ (see FIG. 3(l)). Thereafter, an interlayer dielectric film, contact holes and metal wiring are formed by known methods.

As described above, in the case where the element isolation insulating film is required to be formed between adjacent gate electrodes without forming trenches within the substrate as in the above embodiment, more particularly, in the case where the element isolation insulating film is to be formed thin to the sidewalls of the gate electrodes and thick in a region to be exposed during the etching of the ONO film for forming the control gates, it is necessary to etch the insulating film round at the final stage of forming the embedded insulating film. Therefore, the insulating film needs to be deposited thick initially for allowance for the amount to be etched round. That is, it is important to ensure the thickness of the insulating film embedded between elements. The insulating film 10 needs to be deposited in the recess while completely exposing the silicon oxide film 10 on the top face of the silicon nitride film 51 patterned finely as in the embodiment. Therefore, the silicon oxide film 10 in the recess inevitably connects to the silicon oxide film 10 on the protrusion.

Figure 11:
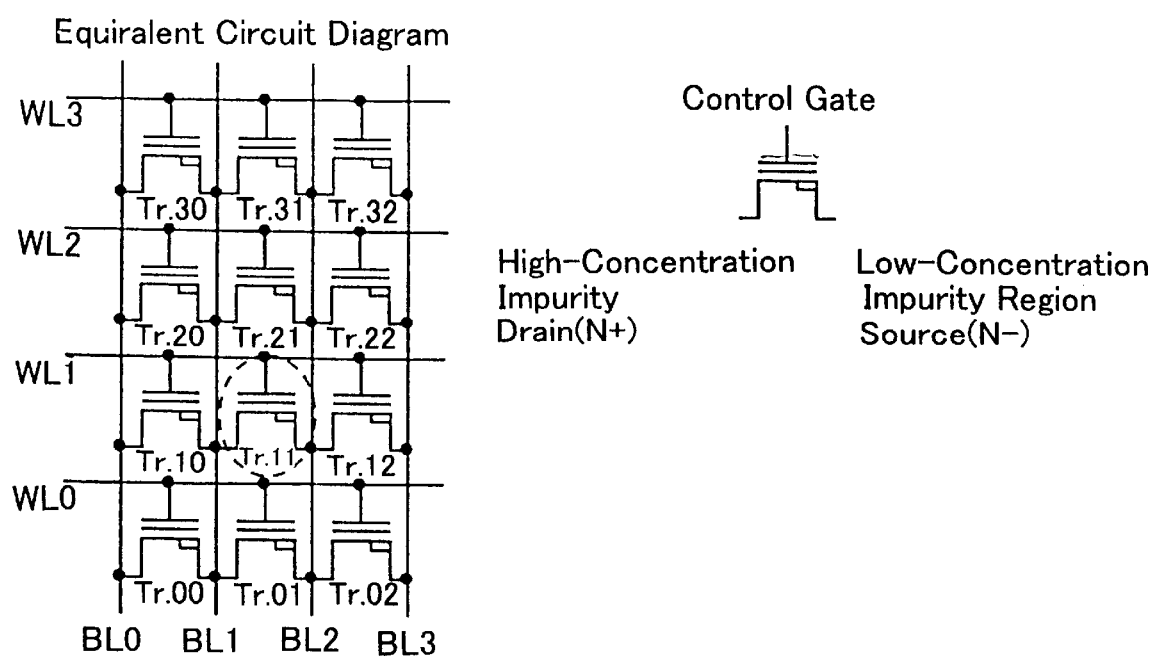
FIG. 11 is an equivalent circuit diagram for illustrating the circuitry of a semiconductor device of the present invention.

FIG. 11 is an equivalent circuit diagram in the thus produced semiconductor memory having asymmetric source/drain regions. Now explanation is given of the circuit and operational principle of the memory.

In FIG. 11, Tr.00 to Tr.32 denote memory cells having floating gates, WL0 to WL3 word lines connected to control gates of the memory cells, and BL0 to BL3 bit lines connected diffusion wiring layers common to drain/sources of the memory cells. The word line WL0 is connected to the control gates of Tr.00, Tr.01 and Tr.02, the word line WL1 is connected to the control gates of Tr.10, Tr.11 and Tr.12, and so on. The bit line BL1 is connected to the drains of Tr.01, Tr.11, Tr.21 and Tr.31 or the sources of Tr.00, Tr.10, Tr.20 and Tr.30, and the bit line BL2 is connected to the drains of Tr.02, Tr.12, Tr.22 and Tr.32 or the sources of Tr.01, Tr.11, Tr.21 and Tr.31.

Figure 13:
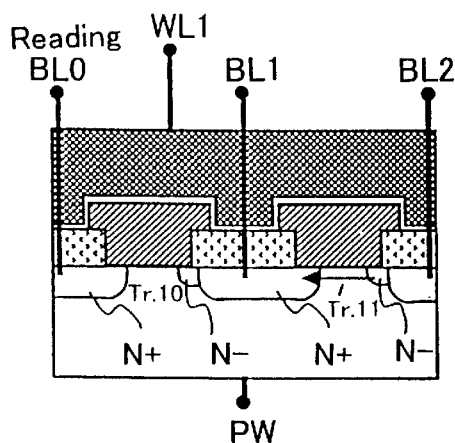
FIG. 13 is a schematic sectional view for illustrating a reading principle of a semiconductor device in accordance with the present invention.
Figure 14:
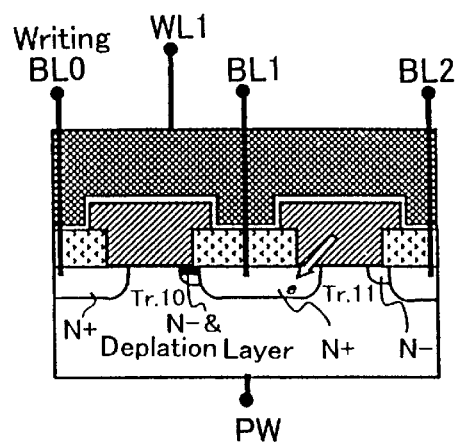
FIG. 14 is a schematic sectional view for illustrating a writing principle of a semiconductor device in accordance with the present invention.
Figure 15:
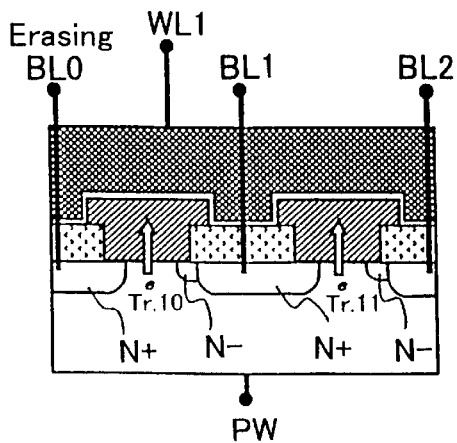
FIG. 15 is a schematic sectional view for illustrating an erasing principle of a semiconductor device in accordance with the present invention.

FIG. 12 shows reading, writing and erasing voltages when Tr.11 in FIG. 11 is selected. FIG. 13 shows a state in which Tr.11 is selected and read, FIG. 14 shows a state in which Tr.11 is selected and written, and FIG. 15 shows a state in which Tr.10 and Tr.12 connected to the word line WL1 including Tr.11 are erased.

Reading operation is explained with reference to FIGS. 12 and 13. The definition of writing a memory cell is Vth<3V and the definition of erasing it is Vth>4V. In this case, information in the memory cell is read by applying 3V and 1V to the control gate and the source, respectively, and grounding the substrate and the drain.

Writing operation is explained with reference to FIGS. 12 and 14. As shown in FIG. 12, Tr. 11 is written by drawing electrons from the floating gate by applying −12V and 4V to the control gate and the drain, respectively, and grounding the substrate to utilize an FN tunnel current flowing in a thin oxide film in a region where the floating gate overlaps the drain diffusion layer.

At this time, a voltage of 4V is applied also to the source of Tr. 10 which is common to the drain to which the positive voltage is applied. However, since the impurity concentration is low in this source, a depletion layer extends toward a substrate side and an electric field applied to the thin oxide film in the region where the floating gate overlaps an actual source diffusion layer is not enough for generating the FN tunnel current. Consequently, the memory cell whose floating gate overlaps the drain (a high impurity concentration layer side) is selectively written.

Erasing operation is explained with reference to FIGS. 12 and 15. Tr. 11 is erased by injecting electrons into the floating gate by applying the voltages of FIG. 12, i.e., 12V to the control gate and −8V to the source/drain regions, to utilize an FN tunnel current flowing in the entire channel region. At this time, Tr. 10 connected to Tr. 11 via the word line WL1 and memory cells connected to the selected wordline which have the same state of voltages applied between the source/drain/substrate as Tr. 11 are erased simultaneously.

Additionally, as the third insulating film of the present invention, usable are inorganic films such as a silicon oxide film and organic films. Further, an electroconductive film such as a silicon film may be used instead of the third insulating film.

Second Embodiment

Now explanation is given of a second embodiment of the process for manufacturing a semiconductor device of the present invention with reference to FIGS. 4(a) to 4(d) to FIGS. 6(i) to 6(l).

Figure 5E:
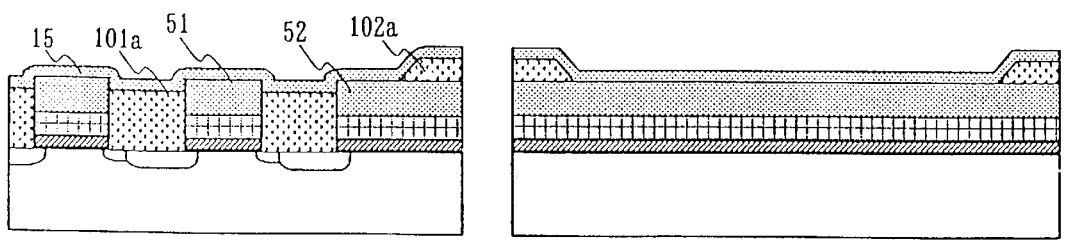
FIGS. 5(e) to 5(h) are schematic sectional views illustrating steps (e) to (h) of the process of manufacturing a semiconductor device in accordance with the second embodiment of the present invention.
Figure 5F:
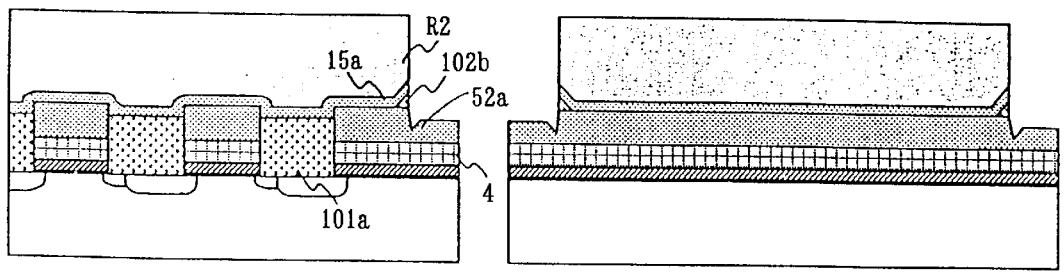
Figure 5G:
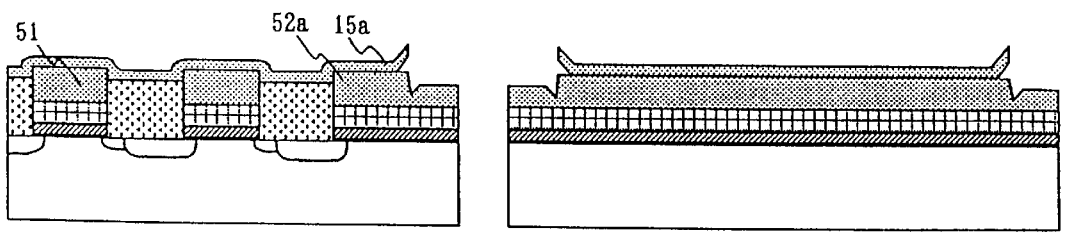
Figure 5H:
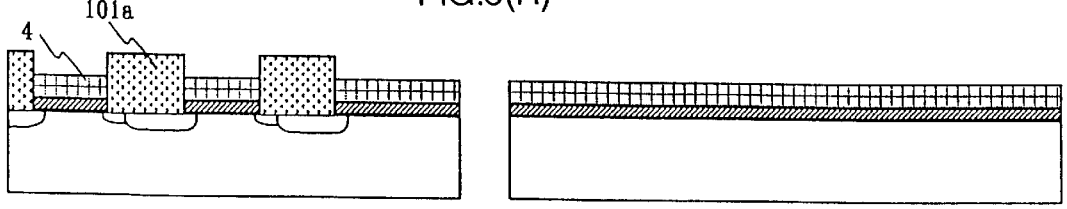
Figure 6I:
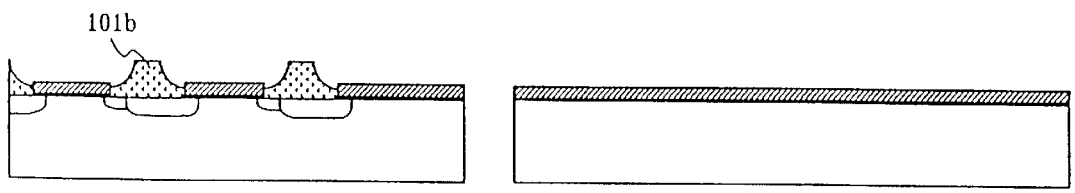
FIGS. 6(i) to 6(l) are schematic sectional views illustrating steps (i) to (l) of the process of manufacturing a semiconductor device in accordance with the second embodiment of the present invention.
Figure 6J:
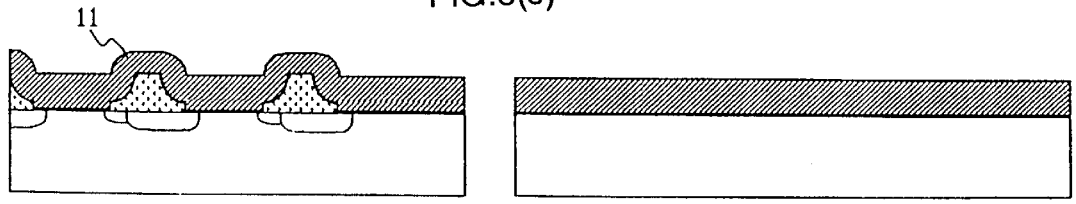
Figure 6K:
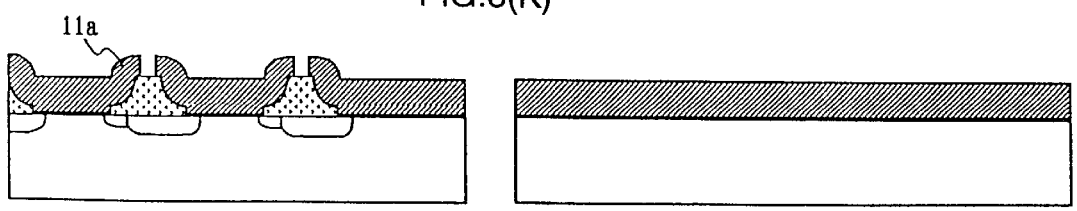
Figure 6L:
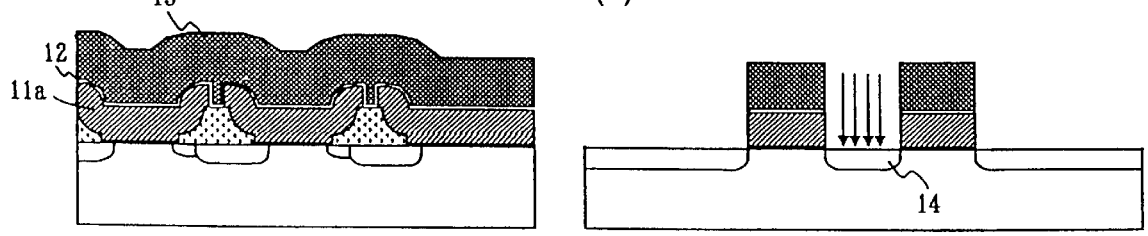

Steps up to FIG. 5(e) are the same as in the first embodiment. In FIG. 10 and FIG. 5(f), the silicon nitride film 15 and the remaining silicon oxide film 102a are partially removed by reactive ion etching using as a mask a resist film R2 patterned to have an opening above the remaining silicon oxide film 102a by photolithography. At this time, the silicon nitride film 52 underlying the remaining silicon nitride film 102a may acceptably be etched down so long as the silicon oxide film 4 and the embedded silicon oxide film 101a are not exposed. By this step, the embedded oxide film 101a is covered with the silicon nitride films 51, 52a and 15a, and the remaining silicon oxide film 102a is partially removed. Accordingly, the etch amount in the following wet etch-back method (with diluted hydrofluoric acid) can be reduced. Further, if the boundary of the resist film R2 is able to be set at a site where the mask layer 15 contacts the upper face of the silicon nitride film 52 closely, the remaining silicon oxide film 102a is completely removed by the above-described reactive ion etching, the wet etch-back method can be omitted.

Third Embodiment

Now explanation is given of a third embodiment of the process for manufacturing a semiconductor device of the present invention with reference to FIGS. 7(a) to 7(d) to FIGS. 9(i) to 9(l).

Figure 7A:
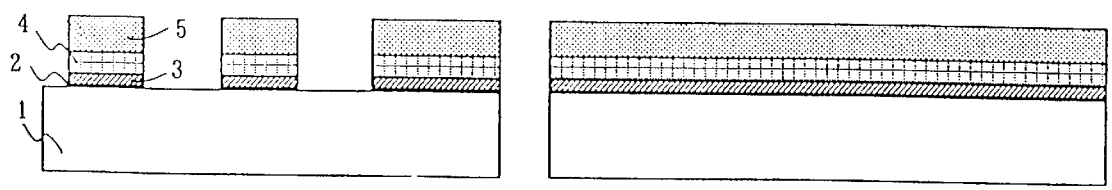
FIGS. 7(a) to 7(d) are schematic sectional views illustrating steps (a) to (d) of a process of manufacturing a semiconductor device in accordance with a third embodiment of the present invention.
Figure 7B:
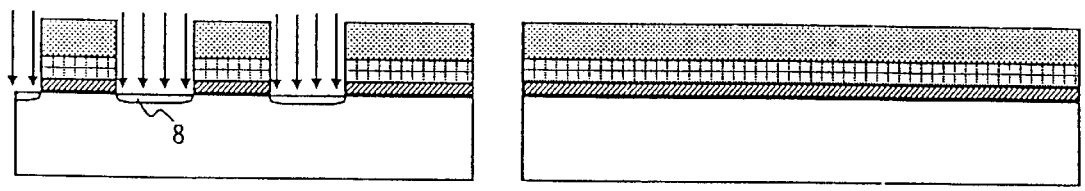
Figure 7C:
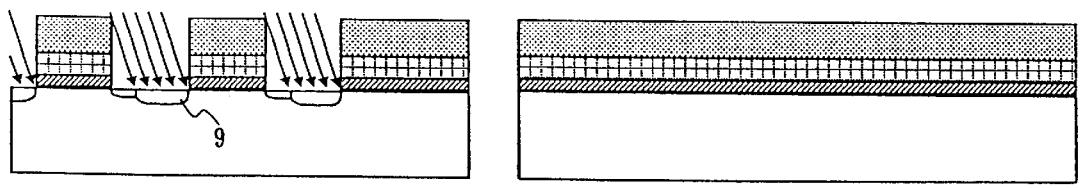
Figure 7D:
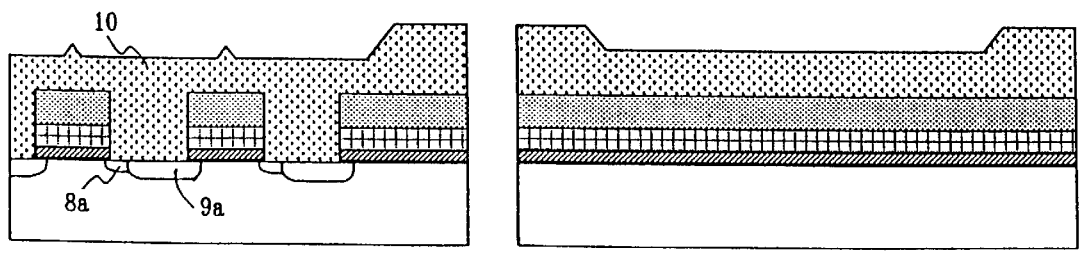
Figure 8E:
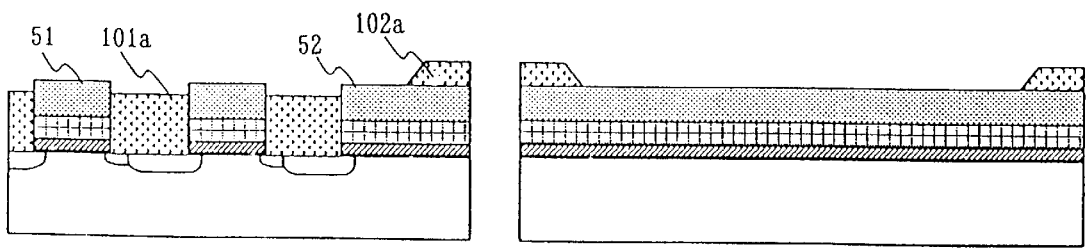
FIGS. 8-(e) to -8(h) are schematic sectional views illustrating steps (e) to (h) of the process of manufacturing a semiconductor device in accordance with the third embodiment of the present invention.
Figure 8F:
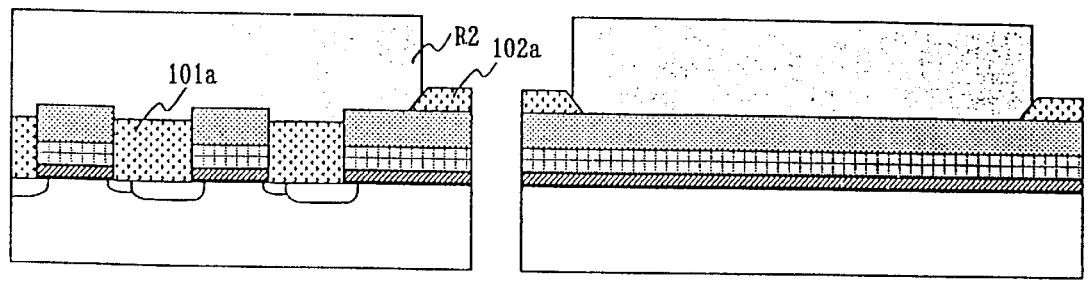
Figure 8G:
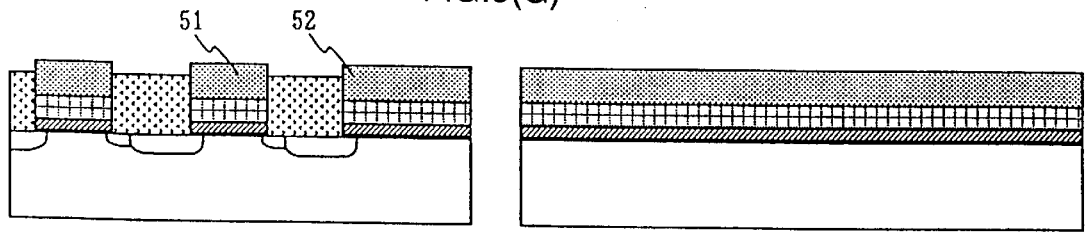
Figure 8H:
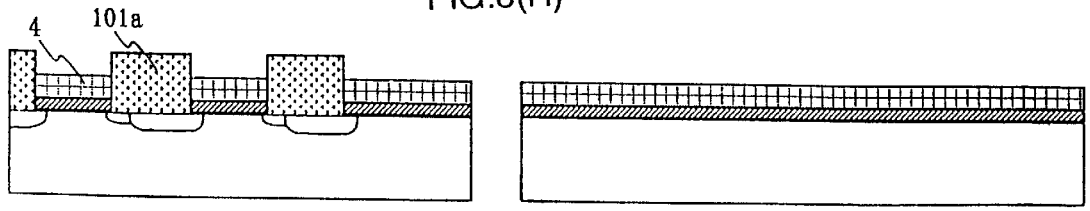
Figure 9I:
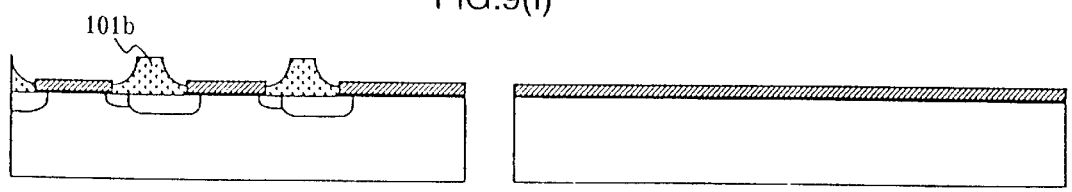
FIGS. 9(i) to 9(l) are schematic sectional views illustrating steps (i) to (l) of the process of manufacturing a semiconductor device in accordance with the third embodiment of the present invention.
Figure 9J:
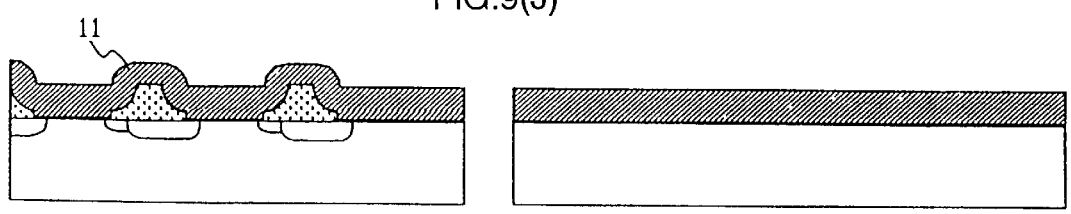
Figure 9K:
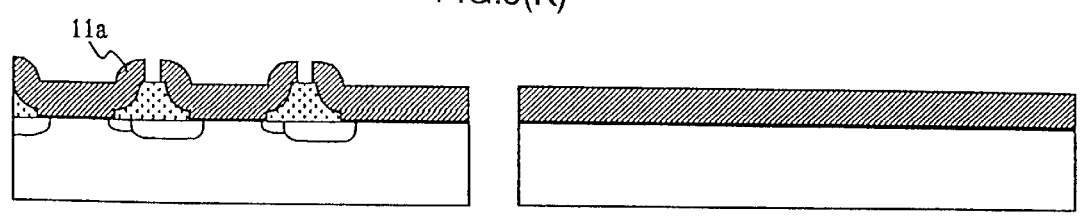
Figure 9L:
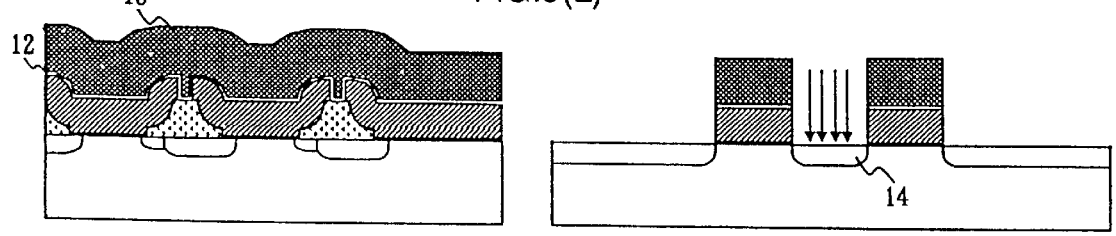

Steps up to FIG. 7(d) are the same as in the first and second embodiments. As shown in FIG. 8(e), the entire surface of the silicon oxide film 10 is etched back by the wet etch-back process (with diluted hydrofluoric acid), the top face of the silicon nitride film 51 patterned finely are completely exposed. Thereafter, as shown in FIG. 10 and FIG. 8(f), the remaining silicon oxide film 102a is removed by the wet etch-back process using a resist film R2 formed to have an opening above the remaining silicon oxide film 102a by photolithography as a mask. At this time, reactive ion etching may be used in combination with the wet etch-back process. More preferably, the resist mask R2 is formed of a resist film which is resistant to diluted hydrofluoric acid and has strong adhesion to the underlying insulating film. In this embodiment, it is possible to omit the step of depositing a CVD insulating film (e.g., SiN) as a mask layer and the step of patterning the CVD insulating film, which will lead to cost reduction.

Forth Embodiment

Now explanation is given of a forth embodiment of the process for manufacturing a semiconductor device of the present invention with reference to FIGS. 1(a) to 1(d) to FIGS. 3(i) to 3(l). The forth embodiment is different from the first embodiment only in a film to be the mask layer.

Figure 1D:
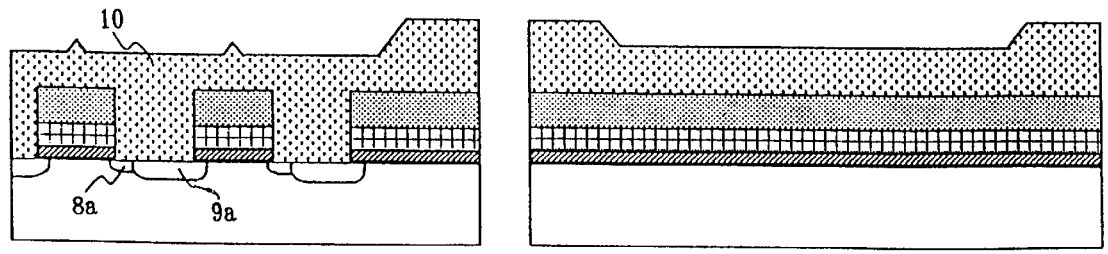

Steps up to FIG. 1(d) are the same as in the first and second embodiments. As shown in FIG. 2(e), the entire surface of the silicon oxide film 10 is etched back by the wet etch-back process (with diluted hydrofluoric acid) to completely expose the top face of the silicon nitride film 51 patterned finely. Thereafter, a mask layer 15 is formed of a polycrystalline silicon film which has a large etching selective ratio to the underlying silicon oxide film 102a remaining. Accordingly, the configuration shown in FIG. 2(f) can be easily obtained. The polycrystalline silicon film also has a large etching selective ratio in the wet etch-back process (with diluted hydrofluoric acid) used in a later step, and consequently, a desired configuration can be easily obtained with good control.

Fifth Embodiment

Figure 16:
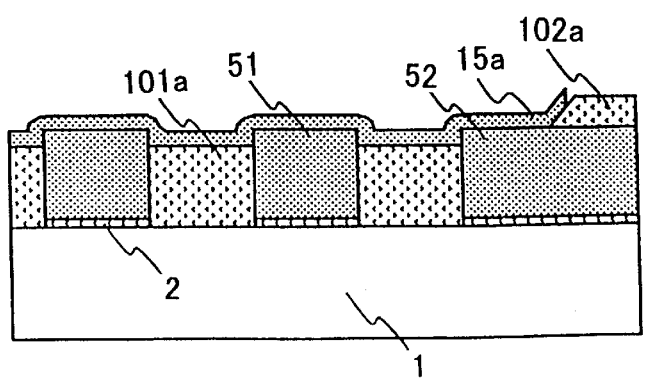
FIG. 16 is a schematic view for illustrating the construction of a semiconductor device in accordance with the present invention.
Figure 17A:
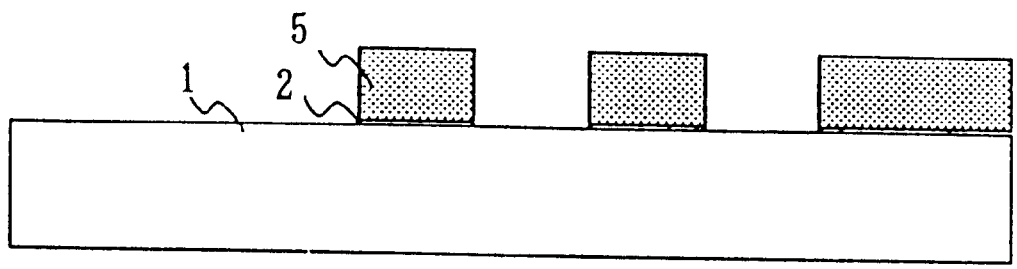
FIGS. 17(a) to 17(c) are schematic sectional views illustrating steps (a) to (d) of a prior-art process of manufacturing a semiconductor device.
Figure 17B:
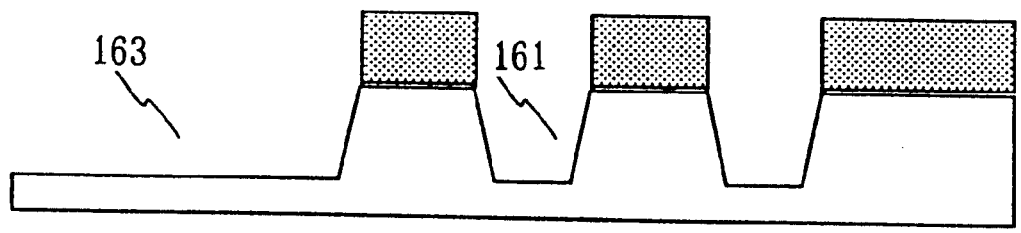
Figure 17C:
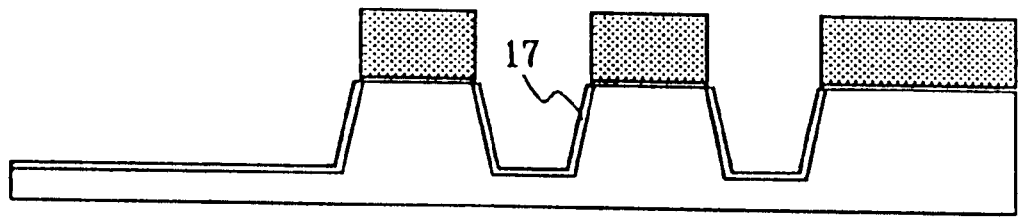
Figure 18D:
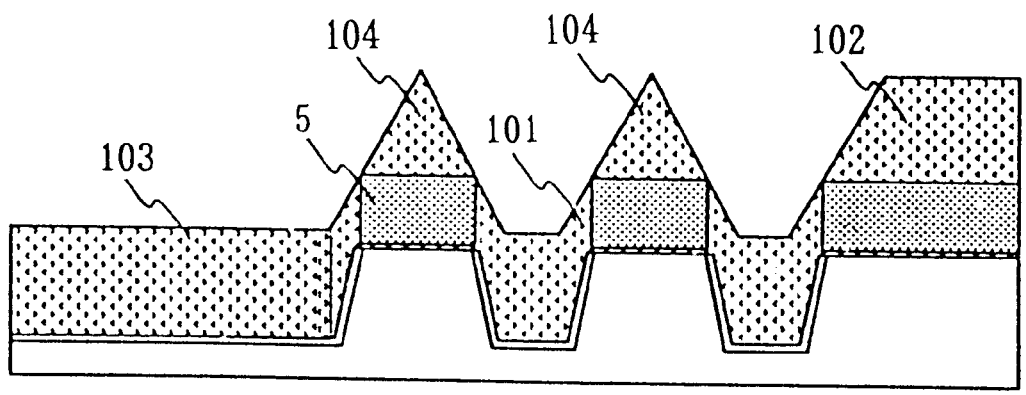
FIGS. 18(d) to 18(f) are schematic sectional views illustrating steps (d) to (f) of the prior-art process of manufacturing a semiconductor device.
Figure 18E:
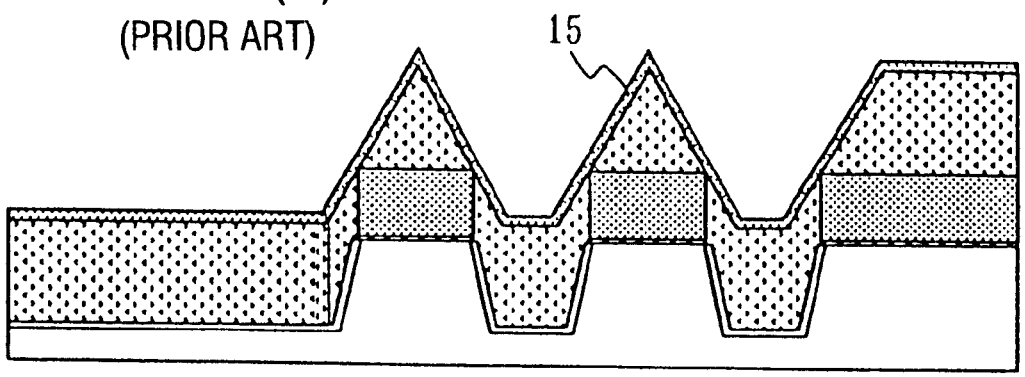
Figure 18F:
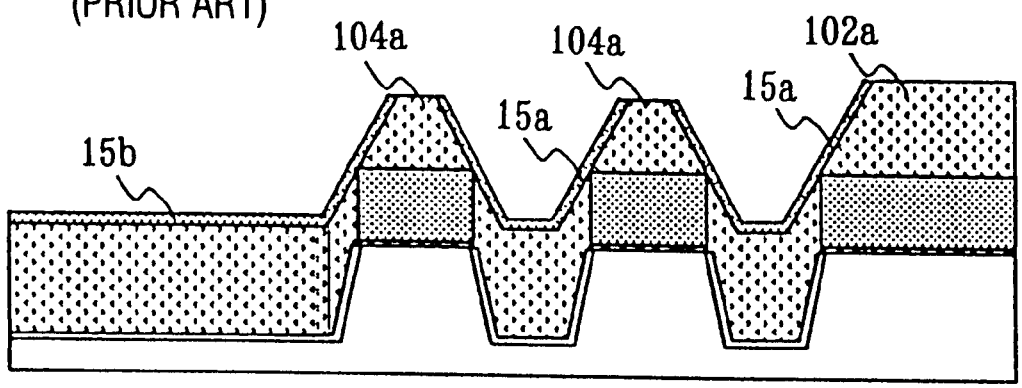
Figure 19G:
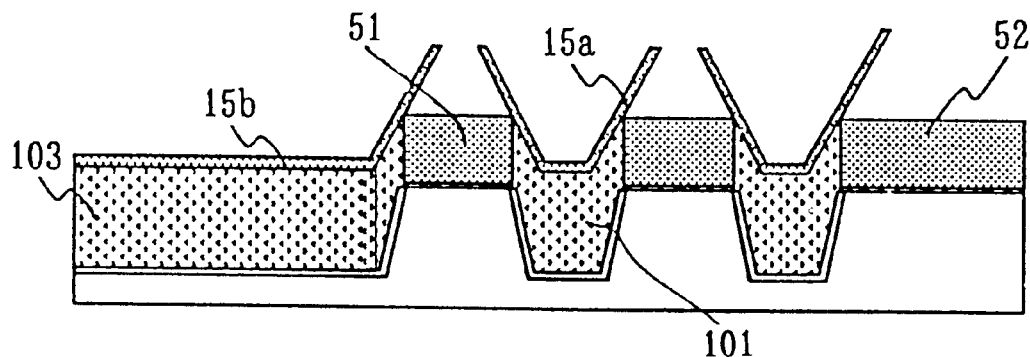
FIGS. 19(g) to 19(i) are schematic sectional views illustrating steps (g) to (i) of the prior-art process of manufacturing a semiconductor device.
Figure 19H:
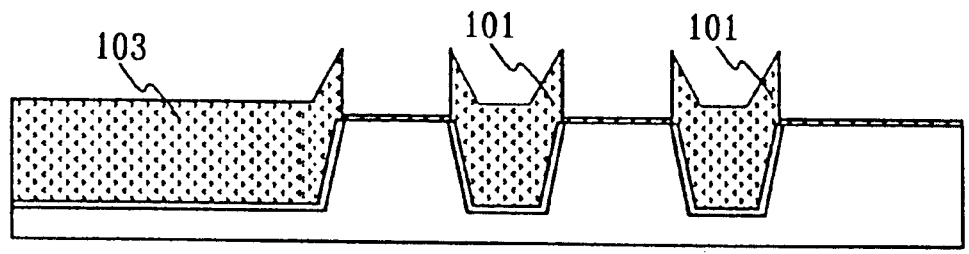
Figure 19I:
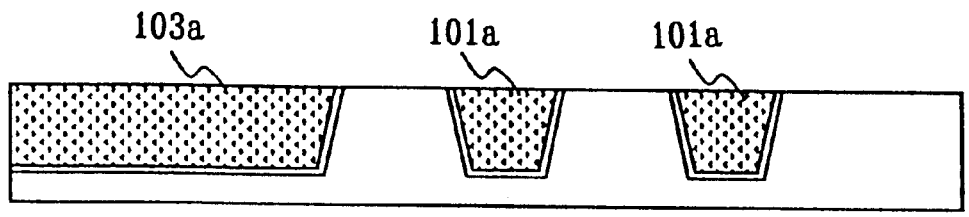
Figure 20A:
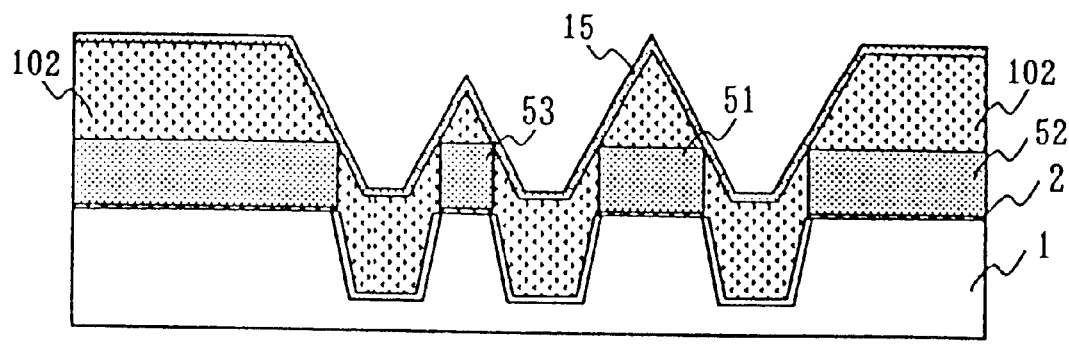
FIGS. 20(a) to 20(c) are schematic sectional views of a major part of a semiconductor device for illustrating problems of the prior-art manufacturing process to be solved.
Figure 20B:
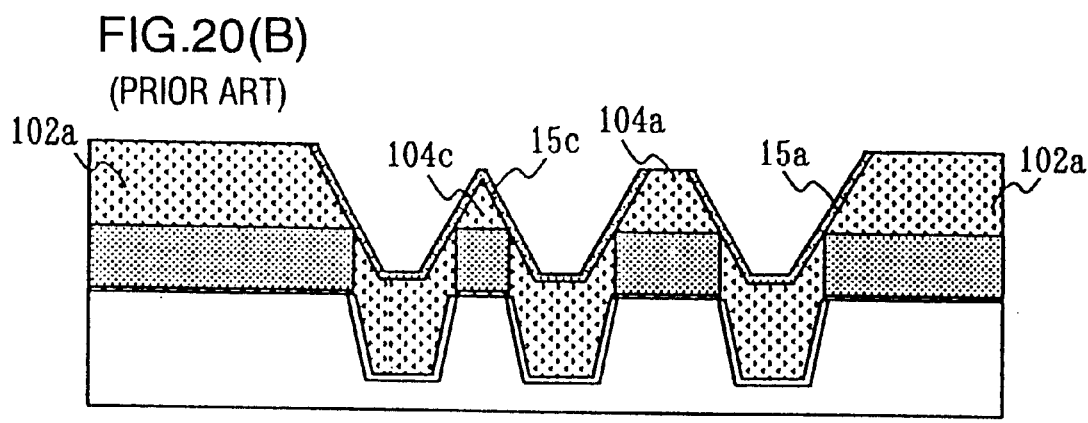
Figure 20C:
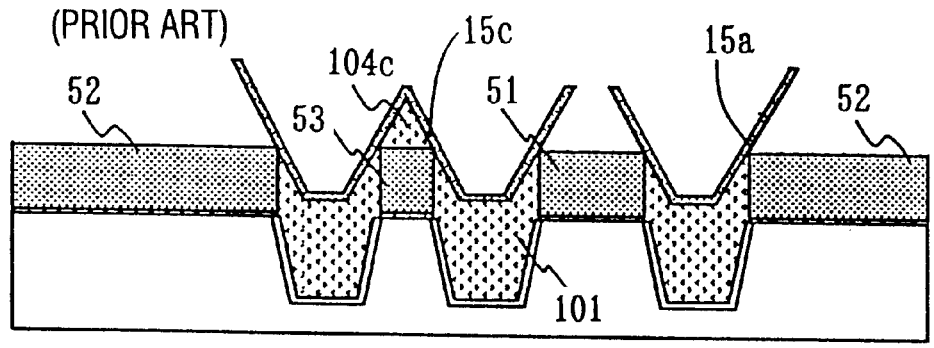
Figure 21A:
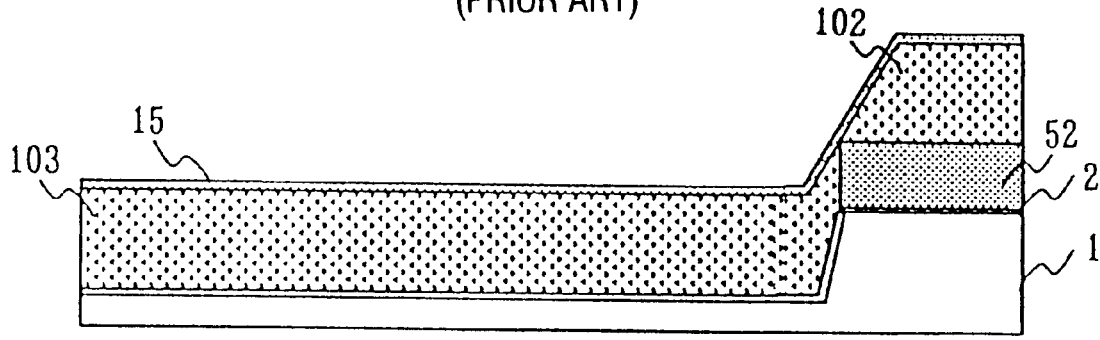
FIGS. 21(a) to 21(c) are schematic sectional views of a major part of a semiconductor device for illustrating problems of the prior-art manufacturing process to be solved.
Figure 21B:
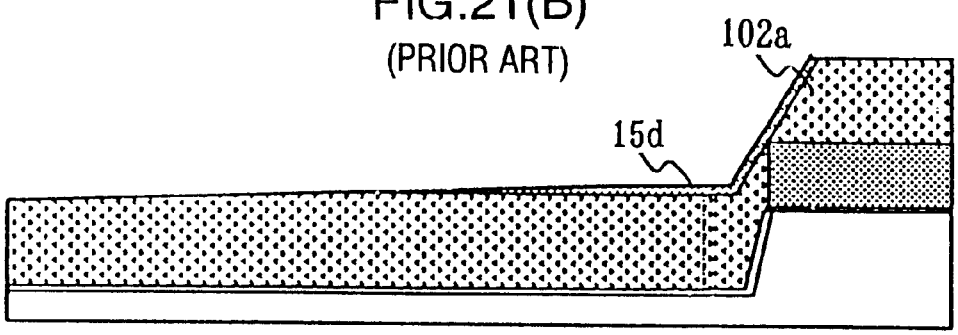
Figure 21C:
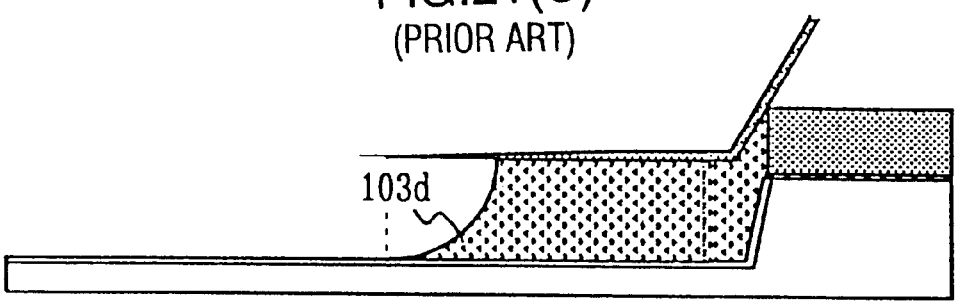

Now detailed explanation is given of a fifth embodiment with reference to FIG. 16.

When an embedded silicon oxide film 101a as an insulating film for element isolation is formed in a patterned silicon nitride film which is formed on a p-type substrate with intervention of a silicon oxide film, the silicon oxide film 101a at least on the silicon nitride film 51 of the fine protrusion is completely removed, and the side faces and top faces of the silicon nitride films 51 and 52 of all the protrusions are partially removed. In this state, a mask layer 15a is formed on the exposed top and side faces of the protrusions and on the top face of the insulating layer in recesses. Thereby the mask layer 15a contacts the silicon nitride films 51 and 52 closely by two planes. By using the wet etch-back process (with diluted hydrofluoric acid) in this state, it becomes possible to selectively remove the silicon oxide film 102a while at the same time the embedded oxide film 101a is protected. Consequently, the thickness of the embedded oxide film 101a can be easily ensured. Thus good insulating films for element isolation can be formed stably without using the CMP process.

The present invention has been described referring to the first to fifth embodiments in which the protrusions and the recesses are formed on the semiconductor substrate, but it is understood that the invention is also applicable to a semiconductor device whose protrusions and recesses are formed by forming trenches in a semiconductor substrate itself.

According to the present invention, after the element isolation insulating film is filled in the recess, the insulating film is completely removed from the top face of a narrow protrusion, i.e., the top face of a fine stopper film, by etching. At this etching, the insulating film filled in the recess is etched back so that its top face becomes lower than the top face of the stopper film. Thereby, at least parts of the top faces of all the patterned stopper films and parts of their side faces are exposed, which improves the adhesion to the mask layer formed thereon and entirely separate the filled insulating film from triangular or trapezoid films remaining on the stopper films. Therefore, the process is less restricted and the semiconductor device is less damaged, and good insulating films for element isolation can be formed stably without using the CMP process.

Especially, as regards the production process of a semiconductor memory in which trenches are not formed in the semiconductor substrate and the insulating film is filled in recesses which are formed on the semiconductor substrate by patterning, the embedded insulating films can be formed in the recesses between the floating gates without using a flattening technique by the CMP process. Also the insulating film can be ensured to have a necessary thickness for protecting the substrate when the control gates are formed by patterning. Therefore, an easy and stable patterning can be performed, the production costs can be reduced greatly, and inexpensive semiconductor memories can be realized. Further, the dependency on the density of a remaining film at polishing, which is remarkable with the CMP process, does not exist, variations in the thickness of the insulating films after embedding is reduced. Thereby the designing of the mask and the process can be facilitated.

What is claimed is:

1. A process for manufacturing a semiconductor device, the process comprising:
   (I) forming a narrow protrusion and a wider protrusion with different widths on a semiconductor substrate so that a recess between the adjacent narrow and wider protrusions has a predetermined width on the semiconductor substrate, and wherein the recess is defined between the narrow and wider protrusions so that no trench is formed in the semiconductor substrate in an area of the recess; and
   (II) in order to form an insulating layer for element isolation in the recess,
      (A) filling an insulating film for forming the insulating layer for element isolation in the recess to a higher level than top surfaces of the respective protrusions;
      (B) removing the insulating film at least from a top surface of the narrow protrusion and etching back the insulating film in the recess to a level lower than the top surface of the narrow protrusion, thereby exposing the top surface and part of a side face of the narrow protrusion, and where the insulating film is also removed so as to expose a part of a side face and a part of a top surface next to the side face of the wider protrusion; and
      (C) forming a mask to cover the exposed top surface and side face portions of the protrusions and also to cover the top surface of the insulating film in the recess, removing the insulating film remaining over the top surface of the wider protrusion, and removing the mask.

2. A process for manufacturing a semiconductor device comprising the steps of:
   (I) forming a plurality of protrusions with different widths so that a recess between adjacent protrusions has a predetermined width on a semiconductor substrate; and
   (II) in order to form an insulating layer for element isolation in the recess,
      (A) filling an insulating film for forming the insulating layer for element isolation in the recess to a higher level than top surfaces of the protrusions;
      (B) removing the insulating film at least from a top surface of a narrow protrusion and etching back the insulating film in the recess to a level lower than the top surface of the narrow protrusion, thereby exposing the top surface and a side face of the narrow protrusion and a side face and a part of a top face next to the side face of a wide protrusion;
      (C) forming a mask to cover the exposed top surfaces and side faces of the protrusions and the top surface of the insulating film in the recess, removing the insulating film remaining from the top surface of the wide protrusion, and removing the mask; and
   wherein the semiconductor device is a semiconductor device having a floating gate formed on a semiconductor substrate with intervention of a tunnel oxide film and a control gate formed on the floating gate with intervention of an interlayer capacitive film, and the plurality of protrusions with different widths on the semiconductor substrate are formed by a film lamination step of sequentially forming the tunnel oxide film, a first electroconductive film to be a part of the floating gate, a first insulating film and a second insulating film, and a patterning step of sequentially patterning each of the laminated films.

3. The process according to claim 2, wherein the step (C) comprises a mask formation step of forming a third insulating film or an electroconductive film having a good contact with the second insulating film and selectively removing the third insulating film or electroconductive film lying on the insulating film for forming the insulating layer for element isolation remaining on the second insulating film, thereby forming a mask, an insulating film removal step of removing the exposed insulating film for forming the insulating layer for element isolation, and a mask removal step of removing the third insulating film forming the mask and the second insulating film.

4. The process according to claim 3, wherein the selective removal of the third insulating film or electroconductive film lying on the insulating film for the insulating layer for element isolation remaining on the second insulating film is carried out by a reactive ion etching of the third insulating film or electroconductive film layer lying on the remaining insulating film for the insulating layer for element isolation using a resist film formed by a photolithography technique as a mask.

5. The process according to claim 2, wherein the step (C) comprises a mask formation step of forming a third insulating film or an electroconductive film having a good contact with the second insulating film and selectively removing at least a part of the insulating film for forming the insulating layer for element isolation remaining on the second insulating film and the third insulating film or electroconductive film lying on said part, thereby forming a mask, an insulating film removal step of removing the rest of the insulating film for forming the insulating layer for element isolation, and a mask removal step of removing the third film forming the mask and the second insulating layer.

6. The process according to claim 5, wherein the selective removal of at least a part of the remaining insulating film for forming the insulating layer for element isolation and the third insulating film or electroconductive film lying on said part is carried out by reactive ion etching using a resist film formed by a photolithography technique as a mask.

7. The process according to claim 1, wherein the removal of the insulating film remaining on the wide protrusion is carried out by a wet etch-back process using a resist film formed on the exposed top surfaces and side faces of the protrusions and the top surface of the insulating film in the recess as a mask or by a combination of this wet etch-back process and reactive ion etching.

8. The process according to claim 3, wherein the third insulating film or the electroconductive film is an inorganic film.

9. The process according to claim 3, wherein the third insulating film or the electroconductive film is an organic film.

10. The process of claim 1, wherein the mask of step (C) comprises at least one of a nitride film and a resist.

11. The process of claim 1, wherein no trenches are formed in the semiconductor substrate for element isolation regions.

12. The process of claim 2, wherein no trench is formed in a semiconductor substrate in an area of the recess.

13. A process for manufacturing a semiconductor device, the process comprising:

(I) forming a narrow protrusion and a wider protrusion with different widths on a semiconductor substrate so that a recess between the adjacent narrow and wider protrusions has a predetermined width on the semiconductor substrate; and (II) in order to form an insulating layer for element isolation in the recess,
  (A) filling an insulating film for forming the insulating layer for element isolation in the recess to a higher level than top surfaces of the respective protrusions;
  (B) removing the insulating film at least from an entire top surface of the narrow protrusion and etching back the insulating film in the recess to a level lower than the entire top surface of the narrow protrusion, thereby exposing the entire top surface and a part of a side face of the narrow protrusion, and wherein the insulating film is also removed so as to expose a part of a side face and a part of a top surface next to the side face of the wider protrusion; and
  (C) forming a mask to directly cover and contact the exposed entire top surface and side face portions of the narrow protrusion and the exposed part of the top surface of the wider protrusion, and also to cover the top surface of the insulating film in the recess, removing the insulating film remaining over the top surface of the wider protrusion, and removing the mask.

* * * * *